United States Patent [19]

May

[11] Patent Number: 5,420,550
[45] Date of Patent: May 30, 1995

[54] METHOD AND APPARATUS FOR SENSING COMMON MODE ERROR

[75] Inventor: Michael R. May, Austin, Tex.

[73] Assignee: Motorola, Inc., Schaumburg, Ill.

[21] Appl. No.: 265,898

[22] Filed: Jun. 27, 1994

[51] Int. Cl.$^6$ ............ H03K 3/023; H03B 5/04; H03B 5/20; H03L 1/00

[52] U.S. Cl. .................. 331/143; 331/111; 331/177 R; 330/258

[58] Field of Search ............ 331/57, 109, 111, 113 R, 331/143, 144, 145, 153, 177 R, 182, 183, 185, 186; 307/491, 494, 495, 496, 497; 330/258

[56] References Cited

U.S. PATENT DOCUMENTS

| | | | |
|---|---|---|---|
| 5,187,448 | 2/1993 | Brooks et al. | 330/258 |
| 5,254,956 | 10/1993 | Nishijima | 330/258 |
| 5,331,210 | 7/1994 | McCarroll | 307/494 X |
| 5,359,294 | 10/1994 | Ganger et al. | 330/258 |

Primary Examiner—David Mis
Attorney, Agent, or Firm—Timothy W. Markison

[57] ABSTRACT

Common mode errors may be sensed and corrected by receiving an output signal 105-106 and comparing the output signal 105-106 with a predetermined signal level. When the output signal 105-106 is in a first relationship with respect to the predetermined signal level a source current is provided to a integrating element 110. If, however, the output 105-106 is in a second relationship with respect to the predetermined signal level, a sink current is provided to the integrating circuit element 110. Regardless of whether a sink or source current is provided to the integrating circuit element 110, the integrating circuit element 110 generates a common mode information signal 123 which is used to correct for common mode errors.

18 Claims, 2 Drawing Sheets

METHOD AND APPARATUS FOR SENSING COMMON MODE ERROR

TECHNICAL FIELD OF THE INVENTION

This invention relates generally to differential circuits and, in particular, to sensing and correcting common mode errors within such circuits.

BACKGROUND OF THE INVENTION

Differential circuits are used in a variety of circuit applications to provide common mode rejection of noise produced by power supplies. In addition, differential circuits have twice the dynamic range of single ended circuits. Because of these advantages, differential circuits are used in a variety of noise sensitive applications, such as voltage control oscillators, filters, analog-to-digital converters, band-gap references, or voltage reference circuits.

While differential circuits offer the above-mentioned advantages, there are certain problems with using such circuits. For example, the differential circuits may produce a common mode error due to balancing errors with the differential circuit, noise, or input variations. The common mode error causes the outputs of the differential circuits to drift and, depending on the amount of drift, the outputs may distorted beyond usability. This is particularly disadvantageous for differential circuits that are used in voltage control oscillators.

In a voltage control oscillator, the differential circuit provides an output frequency reference based on a received input voltage signal. The input voltage signal is converted into a current which is used to charge and discharge a capacitor. The voltage impressed upon the capacitor provides the input signals to the differential circuit, wherein the direction of the current, and thus the charging and discharging, is controlled by a differential threshold detector that switches the current direction when one of the differential output reaches a certain threshold. Thus, the voltage controlled oscillator provides a regulated frequency signal based on the received input voltage signal.

When common mode error is present within the differential circuit, the average of the differential outputs is not at a desired level. Under this condition, the voltage controlled oscillator is slowed and is not operating at an optimal level. This is further complicated as the supply voltage is reduced, which is a popular design requirement in an effort to minimize power consumption.

As the common mode error increases, the above mentioned effects likewise increase until the voltage controlled oscillator is inoperable. This occurs when the common mode, or average signal value, of the differential output approaches one of the voltage supply rails. As the differential output approaches a supply rail, one output is practically lost causing the differential threshold detector to detect only one differential output and not the other. Thus, shutting down the voltage controlled oscillator.

One approach for to limit common mode error is to couple a common mode feedback amplifier to the differential circuit. The common mode feedback amplifier minimizes common mode error by sensing, via a switched capacitor sensing circuit, the common mode of the differential output and correcting any errors sensed. While this approach works well in many applications, it does not work well when the output frequency of the differential circuit is high because the switching capacitors must be switched at a rate much higher than the frequency of the signal that is being sensed. In a high frequency application, where the signal to be sampled is the greatest frequency in the circuit, the switching capacitor sensing circuit will not work.

Therefore, a need exists for method and apparatus that will sense and correct common mode errors of differential circuits used in high frequency applications without slowing the differential circuits operation as the supply voltage is reduced.

DETAILED DESCRIPTION OF A PREFERRED EMBODIMENT

Generally, the present invention provides a method and apparatus for sensing and correcting common mode error. This is accomplished by receiving an output signal and comparing that output signal with a predetermined signal level. When the output signal is in a first relationship with respect to the predetermined signal level a source current is provided to a integrating element. If, however, the output is in a second relationship with respect to the predetermined signal level, a sink current is provided to the integrating circuit element. Regardless of whether a sink or source current is provided to the integrating circuit element, the integrating circuit element generates a common mode information signal which is used to correct for common mode errors. With such a method and apparatus, common mode errors can be sensed and corrected without the need for switch capacitors and without performance degradation at lower supply voltages.

Figure 1:
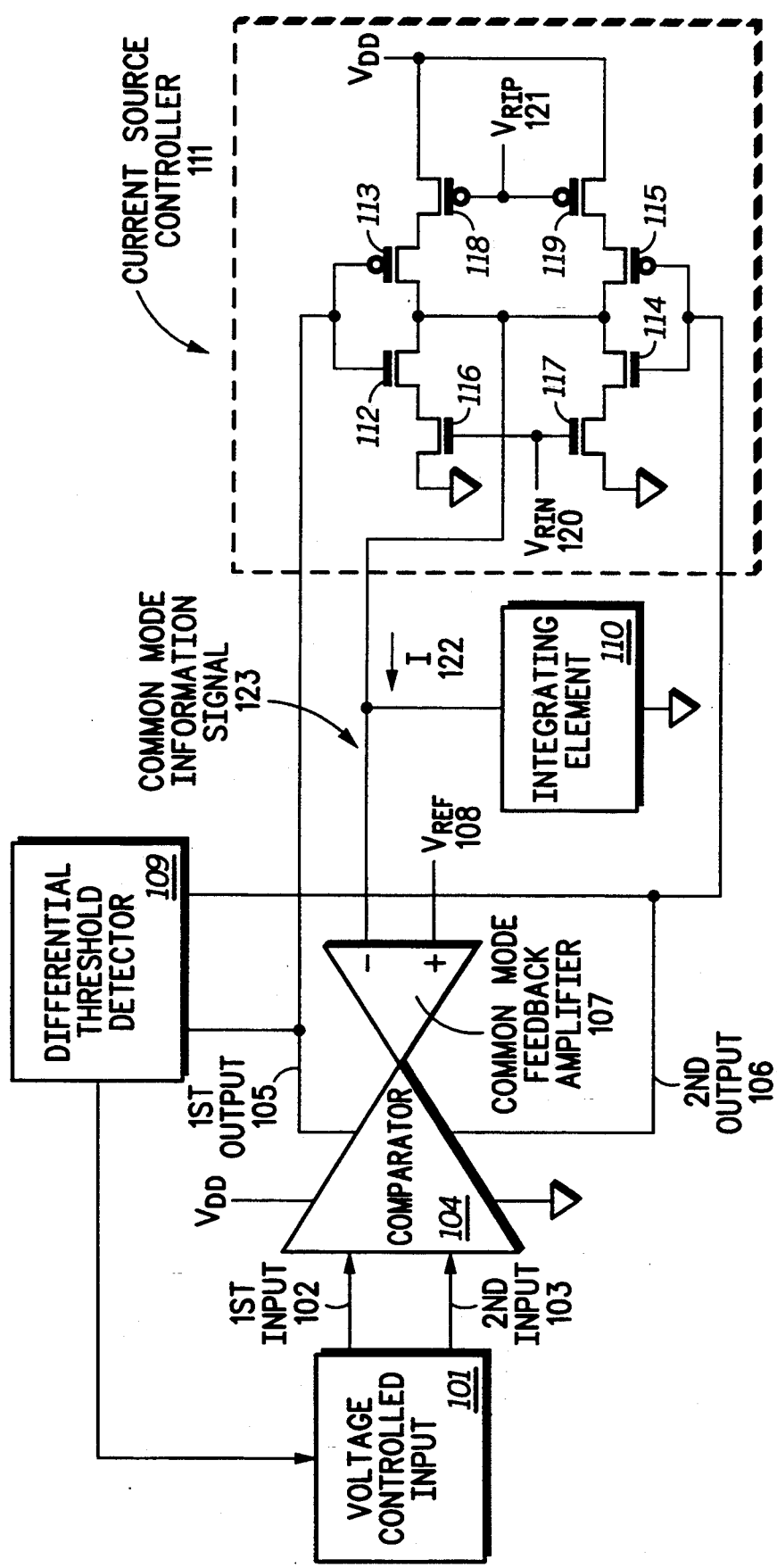
FIG. 1 illustrates a schematic representation of a voltage control oscillator that incorporates the present invention.

FIG. 1 illustrates a voltage control oscillator (VCO) 100 that includes a voltage controlled input 101, a comparator 104, a common mode feedback amplifier 107, a differential threshold detector 109, an integrating element 11 0, and a current source controller 111. The voltage controlled input 101 may be any electronic circuit that provides dual input signals 102-103 to the comparator 104, wherein the input signals 102-103 can be toggled via the signal provided by the differential threshold detector 109. In particular, the voltage control input 101 may be a voltage controlled current source coupled, in parallel, a capacitor. The voltage controlled current source provides a current to the capacitor in proportion to an input voltage received. The polarity of the current alternates based on the signal provided by the differential threshold detector 109. Thus, the alternating charging and discharging of the capacitor provides the differential input voltage to the comparator 104.

The comparator 104, which may be an analog gain block, generates, from the input signals 102 and 103, a differential output signal. The differential output signal includes a first output 105 and a second output 106, wherein the first and second output signals 105-106 oscillate at the rate determined by the input signals 102-103. The comparator 104 is further coupled to the common mode feedback amplifier 107 which provides common mode correction for the comparator 104. The common mode feedback amplifier 107, which may be any type of operational amplifier, generates a common mode error correction signal from a voltage reference 108 and a common mode information signal 123. The common mode error correction signal corrects common mode errors of the comparator 104 to prevent the problems discussed in the background section from occurring.

The integrating element 110, which may be an integrating function circuit such as a capacitor, an integrating amplifier, etc., produces the common mode information signal 123 as a result of the current supplied to it by the current source controller 111. The average magnitude of the common mode information signal 123 is established by the voltage reference 108 selected. Typically, the voltage reference 108 should be about one-half of the supply voltage, thus the average value of the common mode information signal 123 will be about one-half of the supply voltage.

The current provided by the current source controller 111 will be zero current, a sink current, or a source current. The type of current supplied, as well as the magnitude of the current, is determined by the current source controller 111 based on the state of the differential outputs 105 and 106. The differential outputs 105-106 are compared to a predetermined signal level. Determination of the predetermined signal level will be discussed below.

When an average level of the differential outputs 105-106 match the predetermined signal level, an average current of zero is supplied to the integrating element 110. When the outputs 105-106 are in a first relationship with respect to the predetermined signal level, a source current is provided. The magnitude of the source current is dependent on how low the common mode is in comparison with the predetermined signal level. The first relationship results between the predetermined signal level and the differential outputs 105-106 when the common mode offset is low. In otherwords, the average differential outputs 105-106 drifts low, due to common mode error, with respect to the predetermined signal level.

When the differential outputs 105-106 are in a second relationship with respect to the predetermined signal level, the current source controller 111 supplies a sink current to the integrating element 110. The second relationship results between the differential outputs 105-106 and the predetermined signal level when the common mode offset is high, i.e., when the average differential outputs 105-106 drifts high in comparison to the predetermined signal level.

The predetermined signal level is determined based on the topology of the current source controller 111 and the voltage reference 108. As shown, the current source controller 111 includes first and second switching elements 112-113 that are coupled together to receive one of the differential outputs 105-106. In this configuration, the switching elements 112-113 may be transistors where one of the transistors is an inverting transistor, such that the pair of switching elements 112-113 acts as an inverter. For example, if one of the switching elements is a N-channel MOSFET, the other will be a P-channel MOSFET. The switching elements 112-113 are coupled to a first current source 116 and a second current source 118. The current sources 116 and 118 may be transistors biased by first voltage reference 120 and second voltage reference 121. With this current source controller topology, the predetermined signal level is determined by supplying a DC voltage into the input of switching elements 112 and 113. The DC voltage is adjusted until zero current is being sourced to, or sinked from, the integrating element. In practice, the predetermined signal level should be within 1 volt of the voltage reference 108.

The current source controller 111 further comprises a third switching element 114, a fourth switching element 115, a third current source 117, and a fourth current source 119. This section of the current source controller 111 is the mirror image of the section described above, thus the operation of this section is equivalent to the above mentioned section. As would be appreciated by one skilled in the art, the benefits of the present invention may be obtained by utilizing either half of the current source controller 111 separately or by using both halves jointly.

The above mentioned circuit has been discussed with the assumption that the duty cycle of the output signals 105 and 106 are approximately 50%. As would be appreciated by one skilled in the art, the duty cycle may be controlled by varying the currents to the current sources 116-119. For example, by having the current sources 118-119 providing twice the current as the current sources 116-117, a duty cycle of 66% can be obtained. Thus, the ratio between the current sources can be used to set a desired duty cycle. In addition to controlling the current sources, the duty cycle of analog differential outputs (i.e., not providing a rectangular wave output at the supply rails), the predetermined signal level may be adjusted to affect duty cycle. For example, the predetermined signal level may be raised to reduce the duty cycle.

Figure 2:
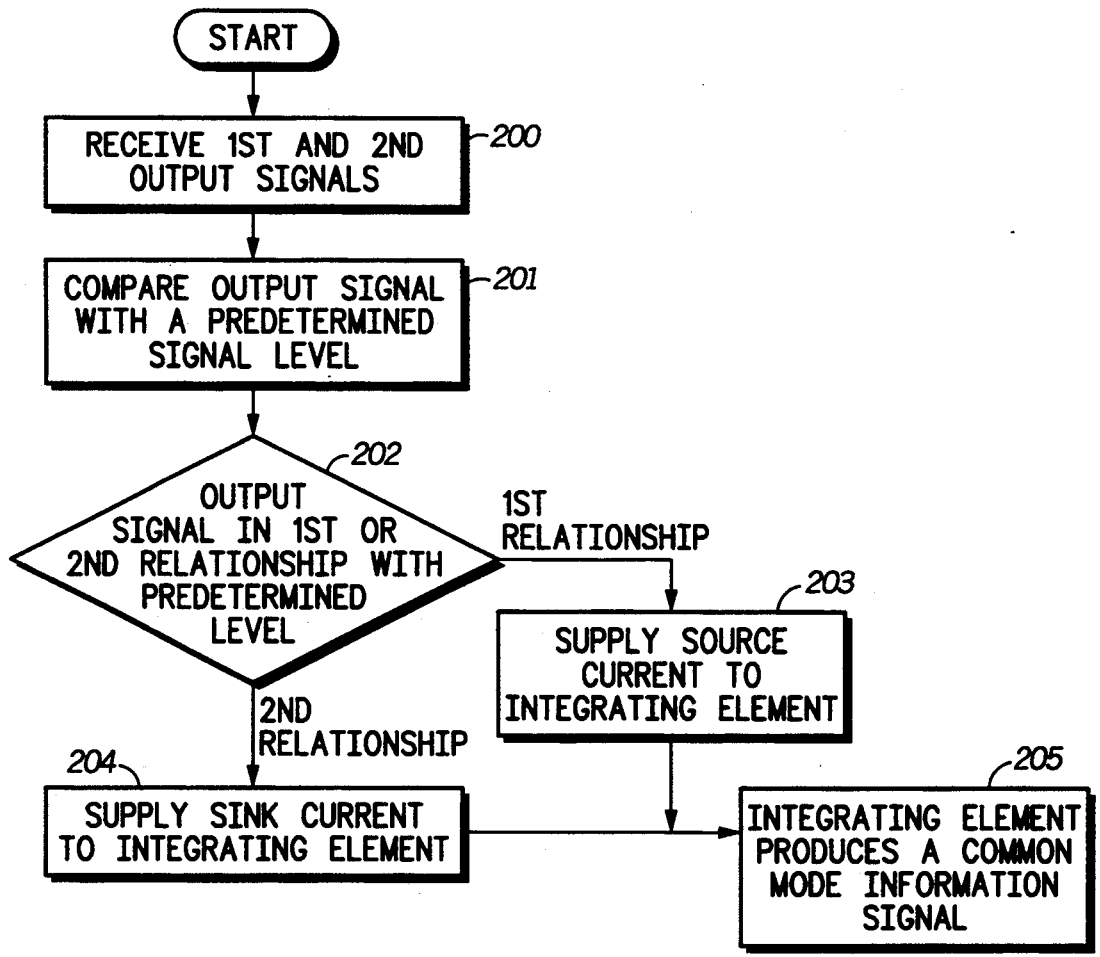
FIG. 2 illustrates a logic diagram that may be used to implement the present invention.

FIG. 2 illustrates a logic diagram that may be used to implement the present invention. In step 200, the current sense controller 111 receives a first and second output signals. These output signals are compared with a predetermined signal level 201. When the first and second output signals are in a first relationship with a predetermined signal level, 202, the current source controller 111 provides a source current to the integrating element 203. The first relationship between the output signals and the predetermined signal level occurs when an average of the output signals is below the predetermined signal level. When this situation occurs, the common mode information signal needs to be raised which is accomplished by providing source current to the integrating element 110.

When the output signals are in a second relationship with respect to the predetermined signal level 202, the current source controller supplies a sink current to the integrating circuit element 204. The second relationship between the output signals and the predetermined signal level occur when the common mode offset is high thus the sink current lowers the common mode information signal 123. By lowering the common mode information signal, the differential output 105-106 are reduced. Regardless of whether the current source control 111 provides sink or source current 203-204, the integrating element produces therefrom a common mode information signal 205. This common mode information signal is utilized by the common mode feedback amplifier 107 to correct common mode errors of the comparator 104.

Figure 3:
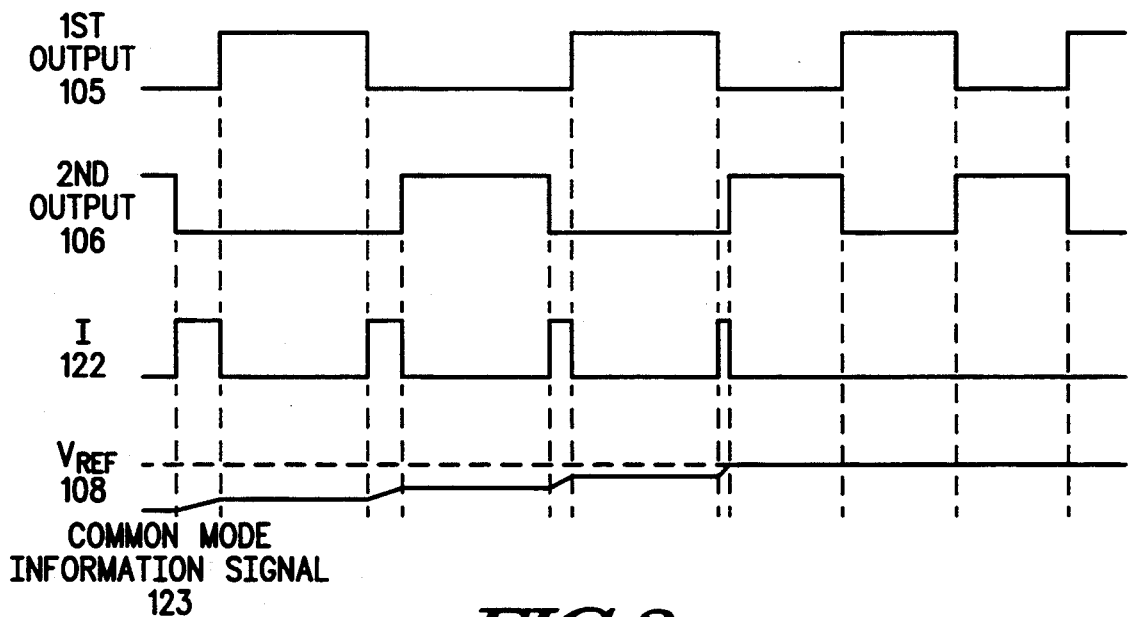
FIG. 3 illustrates a timing diagram of the current source controller of FIG. 1.

FIG. 3 illustrates a timing diagram of a common mode error being corrected in accordance with the present invention. As shown, the first output signal 105 and the second output signal 106 are shown with a common mode that is too low. To correct this, the current source controller 111 provides a source current 122 to the integrating element 110. Over a few cycles, the source current charges the integrating element which causes the common mode information signal 123 to rise near the predetermined signal level 108. Once the common mode information signal 123 is substantially identical to the reference voltage 108, the current source controller 111 ceases to provide a source current to the integrating element indicating that the output signals 105-106 have correct common mode value.

The present invention provides a method and apparatus for sensing and correcting common mode error of differential circuits. Such a method and apparatus allows differential circuits to operate at lower supply voltages without compromising performance levels as occurred with prior art differential circuits. In addition, the present invention allows the current sense controller to sense common mode errors of differential output signals having a relative high frequency. This was not the case for switch capacitor sensing circuits which required the output frequency to be substantially less than the switching frequency of the switching capacitors. The present invention is also a substantial improvement over a purely resistive common mode sensing circuit. In order for a resistive sensing circuit to not slow the differential circuit's performance, the resistors must be of a substantially large resistance value, which are impractical for integrated circuit packages.

I claim:

1. A method for sensing common mode error, the method comprising the steps of:
   a) receiving an output signal;
   b) comparing the output signal with a predetermined signal level;
   c) when the output signal is in a first relationship with respect to the predetermined signal level, generating a source current;
   d) when the output signal is in a second relationship with respect to the predetermined signal level, generating a sink current;
   e) supplying the source current to an integrating element when the output signal is in the first relationship with respect to the predetermined signal level;
   f) supplying the sink current to the integrating element when the output signal is in the second relationship with respect to the predetermined signal level; and
   g) providing, by the integrating element, a common mode information signal.

2. The method of claim 1 further comprises receiving a second output signal and comparing the second output signal with the predetermined signal level.

3. The method of claim 2, wherein steps (c)-(f) further comprise:
   c1) when the second output signal and the output signal are in a first relationship with respect to the predetermined signal level, generating the source current;
   d1) when the output signal and the second output signal are in a second relationship with respect to the predetermined signal level, generating the sink current;
   e1) supplying the source current to an integrating element when the output signal and the second output signal are in the first relationship with respect to the predetermined signal level; and
   f1) supplying the sink current to the integrating element when the output signal and the second output signal are in the second relationship with respect to the predetermined signal level.

4. The method of claim 1 further comprises adjusting the source current and the sink current to adjust a duty cycle of the output signal.

5. The method of claim 1 further comprises adjusting the predetermined signal level to adjust a duty cycle of the output signal.

6. A common mode error sensing circuit comprising:
   an integrating element that provides a common mode information signal based on sink current or source current; and
   a current source controller that provides the source current to the integrating element when a received output signal is in a first relationship with respect to a predetermined signal level, and wherein the current source controller provides the sink current to the integrating element when the received output signal is in a second relationship with respect to the predetermined signal level.

7. The common mode error sensing circuit of claim 6, wherein the integrating element comprises a capacitor.

8. The common mode error sensing circuit of claim 6, wherein the current source controller comprises a first current source operably coupled to a first switching element and a second current source operably coupled to a second switching element, wherein the first switching element is operably coupled to the second switching element to receive the received output signal.

9. The common mode error sensing circuit of claim 8, wherein the current source controller further comprises a third current source operably coupled to a third switching element and a fourth current source operably coupled to a fourth switching element, wherein the third switching element is operably coupled to the fourth switching element to receive a second output signal, wherein the current source controller provides the source current to the integrating element when the second output signal is in the first relationship with respect to the predetermined signal level, and wherein the current source controller provides the sink current to the integrating element when the second output signal is in the second relationship with respect to the predetermined signal level.

10. A method for a correcting common mode errors in a differential circuit, the method comprising the steps of:
   a) generating a differential output, wherein the differential output includes a first output and a second output;
   b) comparing the first output and the second output with a predetermined signal level;
   c) when the first output and the second output are in a first relationship with respect to the predetermined signal level, generating a source current;
   d) when the first output and the second output are in a second relationship with respect to the predetermined signal level, generating a sink current;
   e) supplying the source current to an integrating element when the first output and the second output are in the first relationship with respect to the predetermined signal level;
   f) supplying the sink current to the integrating element when the first output and the second output are in the second relationship with respect to the predetermined signal level;

g) providing, by the integrating element, a common mode information signal; and h) correcting a common mode error of the differential output based on the common mode information signal.

11. The method of claim 10 further comprises adjusting the source current and the sink current to adjust a duty cycle of the differential output.

12. The method of claim 10 further comprises adjusting the predetermined signal level to adjust a duty cycle of the differential output.

13. A differential circuit comprising:
a comparator that provides a differential output, wherein the differential output includes a first output and a second output;
a common mode feedback amplifier operably coupled to the comparator, wherein the correcting amplifier corrects common mode errors of the differential output based on a common mode information signal;
an integrating element coupled to an input of the common mode feedback amplifier, wherein the integrating element provides the common mode information signal based on source current or sink current; and
a current source controller that provides the source current to the integrating element when the first output and the second output are in a first relationship with respect to a predetermined signal level, and wherein the current source controller provides the sink current to the integrating element when the first output and the second output are in a second relationship with respect to the predetermined signal level.

14. The differential circuit of claim 13, wherein the integrating element comprises a capacitor.

15. The differential circuit of claim 13, wherein the current source controller comprises a first current source operably coupled to a first switching element, a second current source operably coupled to a second switching element, a third current source operably coupled to a third switching element, and a fourth current source operably coupled to a fourth switching element, wherein the first switching element is operably coupled to the second switching element to receive the first output and the third switching element is operably coupled to the fourth switching element to receive the received output signal receive the second output.

16. A voltage controlled oscillator that comprises:
a voltage controlled input source that provides a first input signal and a second input signal;
a comparator that provides a differential output from the first input signal and the second input signal, wherein the differential output includes a first output and a second output;
a differentail threshold detector operably coupled to the comparator and the voltage controlled input source, wherein the differential threshold detector toggles the first input signal and the second input signal based on the differential output;
a common mode feedback amplifier operably coupled to the comparator, wherein the common mode feedback amplifier corrects common mode errors of the differential output based on a common mode information signal;
an integrating element coupled to an input of the correcting amplifier, wherein the integrating element provides the common mode information signal based on source current or sink current; and
a current source controller that provides the source current to the integrating element when the first output and the second output are in a first relationship with respect to a predetermined signal level, and wherein the current source controller provides the sink current to the integrating element when the first output and the second output are in a second relationship with respect to the predetermined signal level.

17. The differential circuit of claim 16, wherein the integrating element comprises a capacitor.

18. The differential circuit of claim 16, wherein the current source controller comprises a first current source operably coupled to a first switching element, a second current source operably coupled to a second switching element, a third current source operably coupled to a third switching element, and a fourth current source operably coupled to a fourth switching element, wherein the first switching element is operably coupled to the second switching element to receive the first output and the third switching element is operably coupled to the fourth switching element to receive the received output signal receive the second output.

* * * * *